United States Patent
Choi et al.

(10) Patent No.: US 8,709,935 B2
(45) Date of Patent: *Apr. 29, 2014

(54) SEMICONDUCTOR DEVICE AND METHOD OF FORMING INTERCONNECT STRUCTURE WITH CONDUCTIVE PADS HAVING EXPANDED INTERCONNECT SURFACE AREA FOR ENHANCED INTERCONNECTION PROPERTIES

(71) Applicant: STATS ChipPAC, Ltd., Singapore (SG)

(72) Inventors: DaeSik Choi, Seoul (KR); OhHan Kim, Kyonggi-do (KR); SungWon Cho, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/768,862

(22) Filed: Feb. 15, 2013

(65) Prior Publication Data
US 2013/0154090 A1 Jun. 20, 2013

Related U.S. Application Data

(63) Continuation of application No. 13/149,669, filed on May 31, 2011, now Pat. No. 8,409,979.

(51) Int. Cl.
| H01L 21/44 | (2006.01) |
| H01L 21/50 | (2006.01) |
| H01L 23/52 | (2006.01) |
| H01L 23/48 | (2006.01) |
| H01L 23/485 | (2006.01) |
| H01L 23/498 | (2006.01) |

(52) U.S. Cl.
USPC ........... 438/613; 438/612; 438/108; 257/739; 257/738; 257/E23.021; 257/E23.069

(58) Field of Classification Search
USPC .................. 438/612, 613, 108; 257/739, 738, 257/E23.021, E23.069
See application file for complete search history.

(56) References Cited

U.S. PATENT DOCUMENTS

| 5,545,589 | A | 8/1996 | Tomura et al. | |
| 6,387,734 | B1 | 5/2002 | Inaba et al. | |
| 6,433,426 | B1 * | 8/2002 | Ikegami | 257/737 |
| 6,448,171 | B1 * | 9/2002 | Wang et al. | 438/614 |
| 6,465,879 | B1 * | 10/2002 | Taguchi | 257/673 |
| 6,583,517 | B1 * | 6/2003 | Jimarez | 257/781 |
| 6,700,198 | B2 | 3/2004 | Toya et al. | |
| 6,815,252 | B2 | 11/2004 | Pendse | |
| 6,872,651 | B2 | 3/2005 | Takano | |

(Continued)

*Primary Examiner* — Luan C Thai
(74) *Attorney, Agent, or Firm* — Robert D. Atkins; Patent Law Group: Atkins & Associates, P.C.

(57) ABSTRACT

A semiconductor device has a substrate and first conductive pads formed over the substrate. An interconnect surface area of the first conductive pads is expanded by forming a plurality of recesses into the first conductive pads. The recesses can be an arrangement of concentric rings, arrangement of circular recesses, or arrangement of parallel linear trenches. Alternatively, the interconnect surface area of the first conductive pads is expanded by forming a second conductive pad over the first conductive pad. A semiconductor die has a plurality of interconnect structures formed over a surface of the semiconductor die. The semiconductor die is mounted to the substrate with the interconnect structures contacting the expanded interconnect surface area of the first conductive pads to increase bonding strength of the interconnect structure to the first conductive pads. A mold underfill material is deposited between the semiconductor die and substrate.

21 Claims, 15 Drawing Sheets

(56) References Cited

U.S. PATENT DOCUMENTS

| | | |
|---|---|---|
| 7,129,586 B2 | 10/2006 | Kashiwazaki |
| 7,170,170 B2 | 1/2007 | Yeo |
| 7,170,172 B2 | 1/2007 | Tomimori et al. |
| 7,208,834 B2* | 4/2007 | Lee et al. .................. 257/737 |
| 7,214,604 B2 | 5/2007 | Kim et al. |
| 7,271,483 B2* | 9/2007 | Lin et al. .................. 257/737 |
| 7,364,998 B2 | 4/2008 | Chiu et al. |
| 7,382,050 B2 | 6/2008 | Matsumura et al. |
| 7,420,283 B2 | 9/2008 | Ito |
| 7,521,800 B2 | 4/2009 | Chu et al. |
| 7,735,713 B2 | 6/2010 | Kataoka et al. |
| 7,888,259 B2* | 2/2011 | Zbrzezny et al. ............ 438/612 |
| 2002/0149118 A1* | 10/2002 | Yamaguchi et al. .......... 257/778 |
| 2004/0070042 A1 | 4/2004 | Lee et al. |
| 2006/0108685 A1 | 5/2006 | Tsou et al. |
| 2006/0163725 A1 | 7/2006 | Haba et al. |
| 2007/0045812 A1 | 3/2007 | Heng |
| 2007/0267650 A1* | 11/2007 | Hsieh .............................. 257/99 |
| 2008/0290528 A1* | 11/2008 | Hsu ................................ 257/779 |

\* cited by examiner

US 8,709,935 B2

SEMICONDUCTOR DEVICE AND METHOD OF FORMING INTERCONNECT STRUCTURE WITH CONDUCTIVE PADS HAVING EXPANDED INTERCONNECT SURFACE AREA FOR ENHANCED INTERCONNECTION PROPERTIES

CLAIM TO DOMESTIC PRIORITY

The present application is a continuation of U.S. patent application Ser. No. 13/149,669, now U.S. Pat. No. 8,409,979, filed May 31, 2011, which application is incorporated herein by reference.

FIELD OF THE INVENTION

The present invention relates in general to semiconductor devices and, more particularly, to a semiconductor device and method of forming an interconnect structure with conductive pads having an expanded interconnect surface area for enhanced interconnection properties.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

One common technique of interconnecting a semiconductor die with a printed circuit board or other substrate involves the use of bumps. FIG. 1 illustrates a conventional semiconductor device 10 with flipchip type semiconductor die 12 having an active surface 13 and contact pads 14 formed on the active surface. An insulating or passivation layer 15 is formed over active surface 13 and contact pads 14. A portion of insulating layer 15 is removed by an etching process to expose contact pads 14. An insulating or dielectric layer 16 is formed over insulating layer 15 and the exposed contact pads 14. A portion of insulating layer 16 is removed by an etching process to expose contact pads 14. An electrically conductive layer 18 is conformally applied over the exposed contact pads 14 and insulating layer 16. Conductive layer 18 operates as an under bump metallization (UBM) layer electrically connected to contact pads 14. A conductive pillar 20 is formed over conductive layer 18.

A substrate or PCB 22 has one or more conductive layers 24 and laminated insulating or dielectric layers 26. An insulating layer 28 is formed over insulating layer 26 and conductive layer 24. A portion of insulating layer 28 is removed by patterning, exposure to ultraviolet (UV) light, and developing to expose conductive layer 24. A bump material 30 is deposited over conductive layer 24. Semiconductor die 12 is positioned over and mounted to substrate 22 using a pick and place operation with active surface 13 and conductive pillars 20 oriented toward the substrate. Conductive pillars 20 are metallurgically and electrically connected to conductive layer 24 with bump material 30.

FIG. 2 illustrates another conventional semiconductor device with flipchip type semiconductor die 12 having an active surface 13 and contact pads 14 formed on the active surface. An insulating or passivation layer 15 is formed over active surface 13 and contact pads 14. A portion of insulating layer 15 is removed by an etching process to expose contact pads 14. An insulating or dielectric layer 16 is formed over insulating layer 15 and the exposed contact pads 14. A portion of insulating layer 16 is removed by an etching process to expose contact pads 14. An electrically conductive layer 18 is conformally applied over the exposed contact pads 14 and insulating layer 16. Conductive layer 18 operates as a UBM layer electrically connected to contact pads 14. A bump material 31 is deposited over conductive layer 18.

A substrate or PCB 32 has one or more conductive layers 34 and laminated insulating or dielectric layers 36. An insulating layer 38 is formed over insulating layer 36 and conductive layer 34. A portion of insulating layer 38 is removed by patterning, exposure to UV light, and developing to expose conductive layer 34. A conductive seed layer 39 is formed over conductive layer 34. A conductive pad 40 is formed over conductive seed layer 39. Semiconductor die 12 is positioned over and mounted to substrate 32 using a pick and place operation with active surface 13 and bump material 31 oriented toward the substrate. Bump material 31 are metallurgically and electrically connected to conductive pads 40.

FIG. 3 illustrates another conventional semiconductor device with flipchip type semiconductor die 12 having an active surface 13 and contact pads 14 formed on the active surface. An insulating or passivation layer 15 is formed over active surface 13 and contact pads 14. A portion of insulating layer 15 is removed by an etching process to expose contact pads 14. An insulating or dielectric layer 16 is formed over insulating layer 15 and the exposed contact pads 14. A portion of insulating layer 16 is removed by an etching process to expose contact pads 14. An electrically conductive layer 18 is conformally applied over the exposed contact pads 14 and insulating layer 16. Conductive layer 18 operates as a UBM layer electrically connected to contact pads 14. A bump material 41 is deposited over conductive layer 18.

A substrate or PCB 42 has one or more conductive layers 44 and laminated insulating or dielectric layers 45. An insulating layer 46 is formed over insulating layer 45 and conductive layer 44. A portion of insulating layer 46 is removed by patterning, exposure to UV light, and developing to expose conductive layer 44. A conductive seed layer 47 is formed over conductive layer 44. A conductive pad 48 is formed over conductive seed layer 47. A solderability enhancement layer 49, such as Ni or Au, is formed over conductive pad 48. Semiconductor die 12 is positioned over and mounted to substrate 42 using a pick and place operation with active surface 13 and bump material 41 oriented toward the substrate. Bump material 41 are metallurgically and electrically connected to conductive pads 48 and solderability enhancement layer 49.

In each case of FIGS. 1-3, the bump interconnect structure is susceptible to de-wetting of the UBM and exhibits weak joints and reliability problems. For example, conductive pillar 20 of FIG. 1 induces high stress on semiconductor die 12, leading to cracking around the conductive pillar. Conductive pads 40 and 48 exhibit joint reliability issues due in part to the limited contact surface area between bump material 31 and 41 and the conductive pads, as shown in FIGS. 2 and 3. The cracking and joint reliability reduce manufacturing yield and increase cost.

SUMMARY OF THE INVENTION

A need exists for a reliable interconnect structure robust against cracking and other joint reliability issues. Accordingly, in one embodiment, the present invention is a method of making a semiconductor device comprising the steps of providing a substrate, forming a plurality of conductive pads over the substrate, and expanding an interconnect surface area of the conductive pads by forming a plurality of recesses partially into the conductive pads while retaining a portion of the conductive pads under the recesses.

In another embodiment, the present invention is a method of making a semiconductor device comprising the steps of providing a substrate, forming a first conductive pad over the substrate, and expanding an interconnect surface area of the first conductive pad by forming a second conductive pad over a portion of the first conductive pad.

In another embodiment, the present invention is a method of making a semiconductor device comprising the steps of providing a substrate, forming a first conductive pad over the substrate, and expanding an interconnect surface area of the first conductive pad by forming an irregular interconnect surface of the first conductive pad.

In another embodiment, the present invention is a semiconductor device comprising a substrate and first conductive pad formed over the substrate with an expanded interconnect surface area formed over the first conductive pad.

DETAILED DESCRIPTION OF THE DRAWINGS

Figure 1:
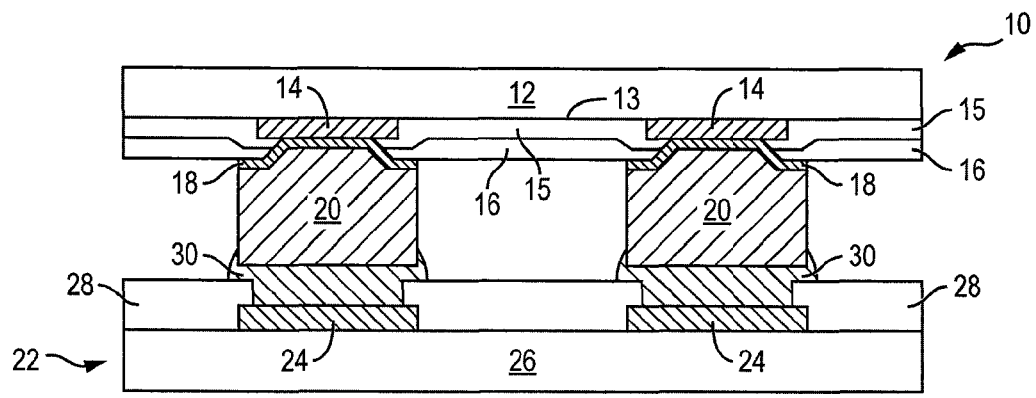
FIG. 1 illustrates a conventional semiconductor die mounted to a substrate with a conductive pillar and bump material.
Figure 2:
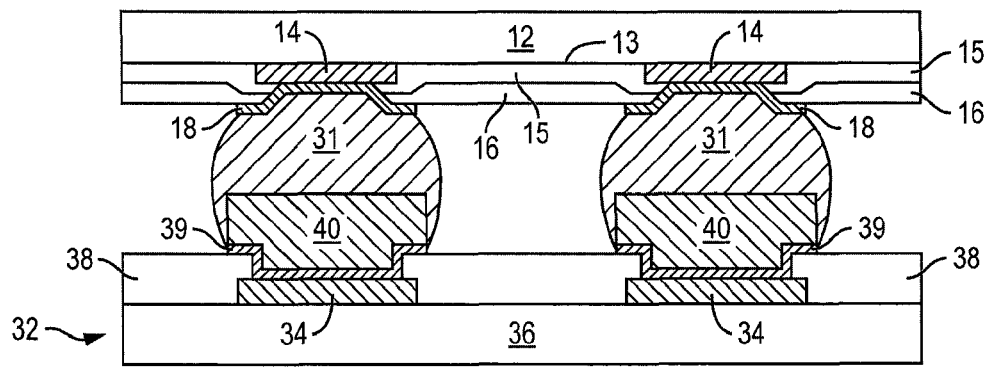
FIG. 2 illustrates a conventional semiconductor die mounted to a substrate with bumps and conductive pads.
Figure 3:
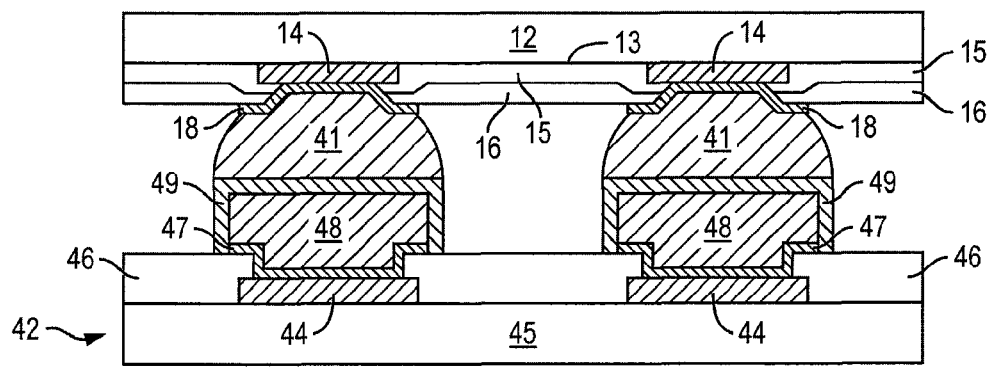
FIG. 3 illustrates a conventional semiconductor die mounted to a substrate with bumps and multi-layered conductive pads.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
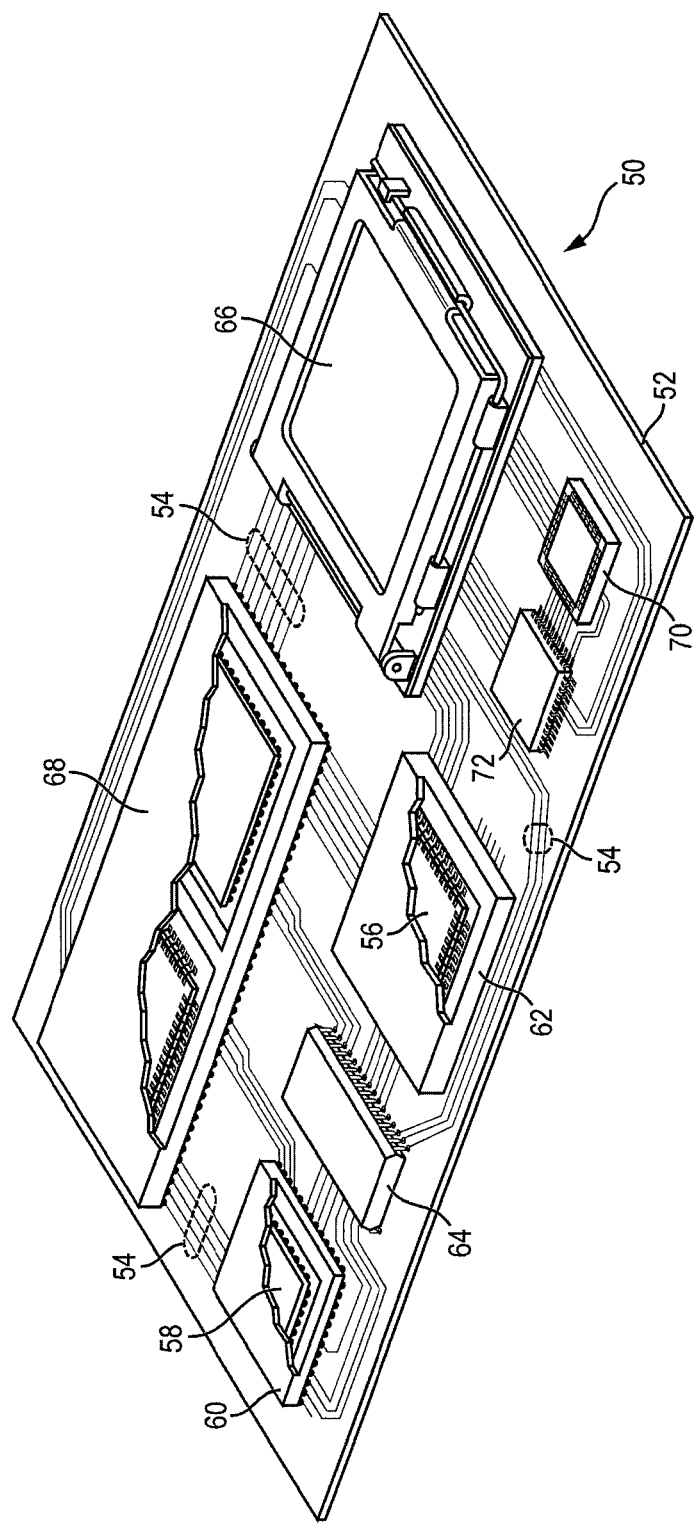
FIG. 4 illustrates a printed circuit board (PCB) with different types of packages mounted to its surface.

FIG. 4 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 4 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
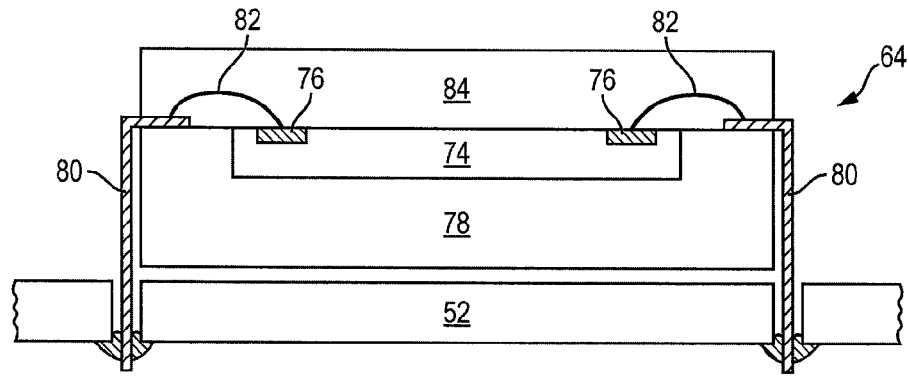
FIGS. 5a-5c illustrate further detail of the representative semiconductor packages mounted to the PCB.
Figure 5B:
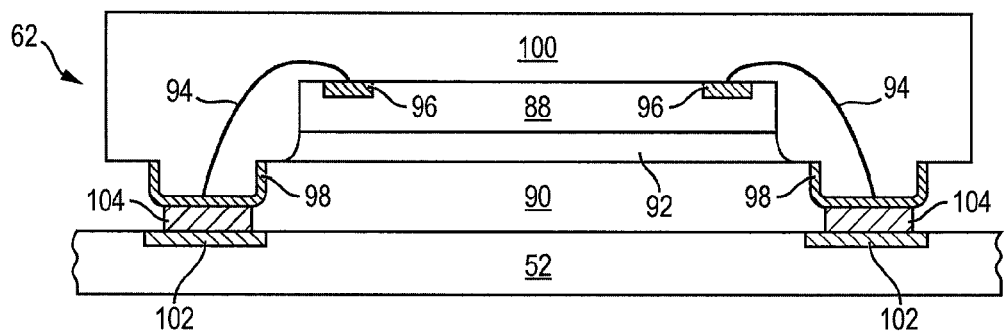
Figure 5C:
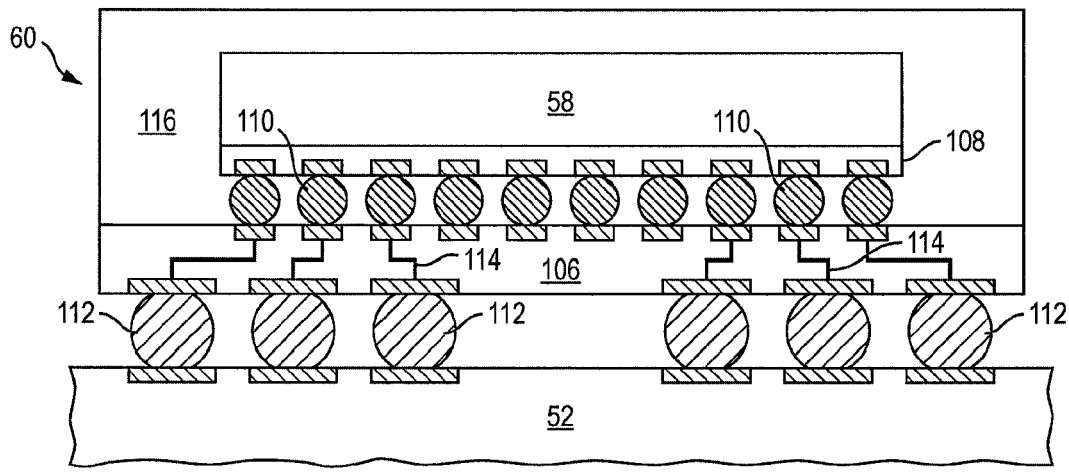

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 5*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 6A:
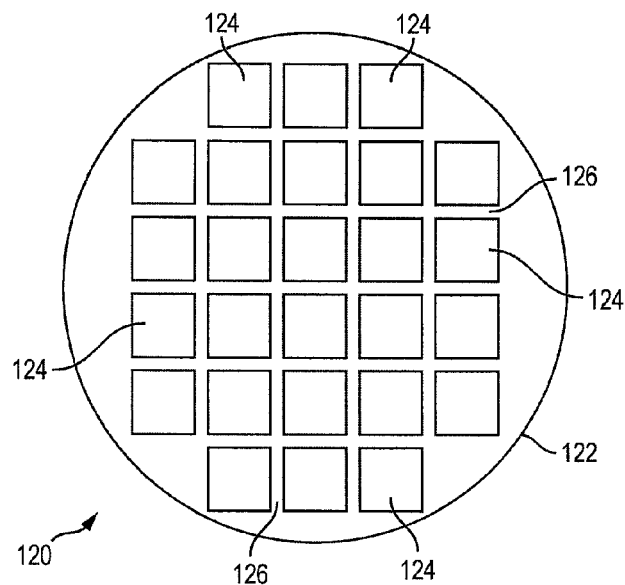
FIGS. 6a-6c illustrate a semiconductor wafer with a plurality of semiconductor die separated by a saw street.

FIG. 6*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 6B:
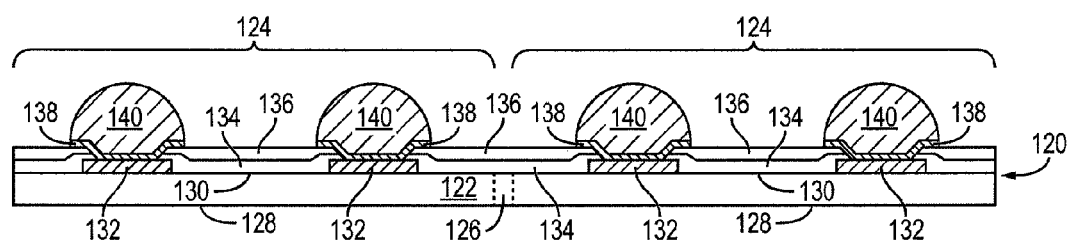

FIG. 6*b* shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 134 is removed by an etching process through a photoresist layer (not shown) to expose conductive layer 132.

An insulating or dielectric layer 136 is formed over insulating layer 134 and the exposed conductive layer 132 using PVD, CVD, printing, spin coating, spray coating, sintering or thermal oxidation. The insulating layer 136 contains one or more layers of $SiO_2$, $Si_3N_4$, SiON, $Ta_2O_5$, $Al_2O_3$, benzocyclobutene (BCB), polyimide (PI), polybenzoxazoles (PBO), or other suitable dielectric material. A portion of insulating layer 136 is removed by an etching process through a photoresist layer to expose conductive layer 132.

An electrically conductive layer 138 is conformally applied over the exposed conductive layer 132 and insulating layer 136 using a patterning and metal deposition process such as printing, PVD, CVD, sputtering, electrolytic plating, and electroless plating. In one embodiment, conductive layer 138 is Ti, titanium tungsten (TiW), or chromium (Cr) formed by sputtering. Alternatively, conductive layer 138 can be one or more layers of Al, Cu, Sn, Ni, Au, Ag, or other suitable electrically conductive material. Conductive layer 138 follows the contour of insulation layer 136 and conductive layer 132. Conductive layer 138 operates as a UBM layer electrically connected to conductive layer 132.

An electrically conductive bump material is deposited over conductive layer 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 using a suitable attachment or bonding process. In one embodiment, the bump material is reflowed by heating the material above its melting point to form balls or bumps 140. In some applications, bumps 140 are reflowed a second time to improve electrical contact to conductive layer 138. Bumps 140 can also be compression bonded to conductive layer 138. Bumps 140 represent one type of interconnect structure that can be formed over conductive layer 138. The interconnect structure can also use stud bump, micro bump, or other electrical interconnect.

Figure 6C:
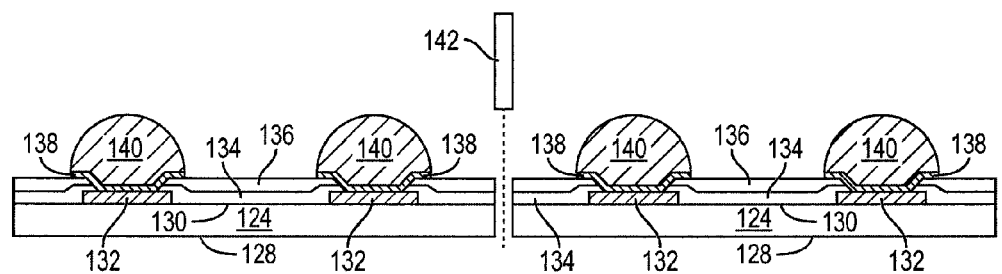

In FIG. 6c, semiconductor wafer 120 is singulated through saw street 126 using a saw blade or laser cutting tool 142 into individual semiconductor die 124.

Figure 7A:
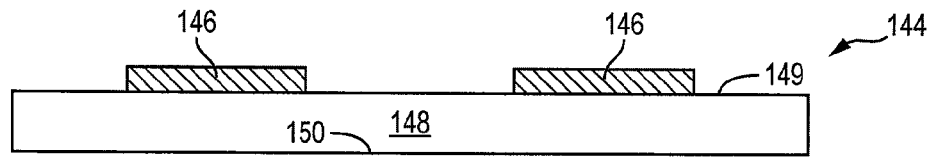
FIGS. 7a-7p illustrate a process of forming a bump structure with conductive pads having recesses to expand the interconnect surface area for enhanced interconnect properties.
Figure 7B:
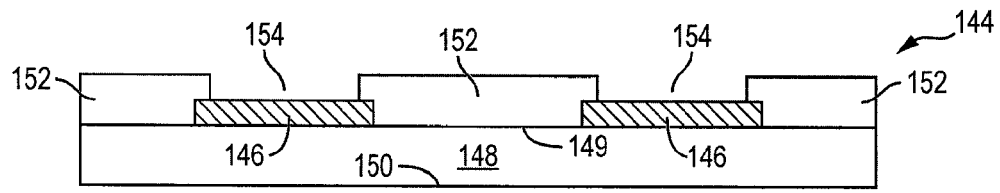
Figure 7C:
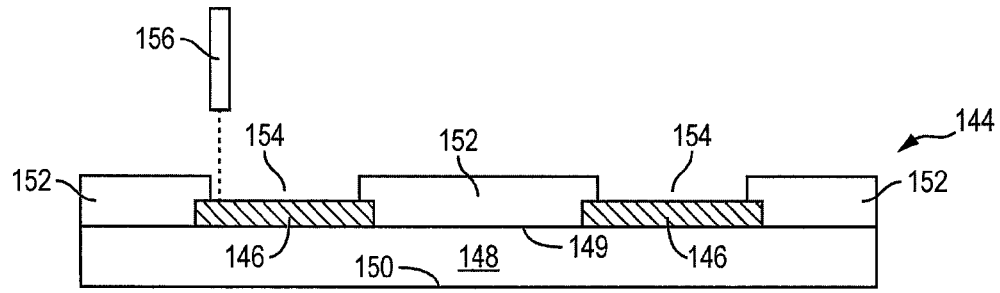
Figure 7D:
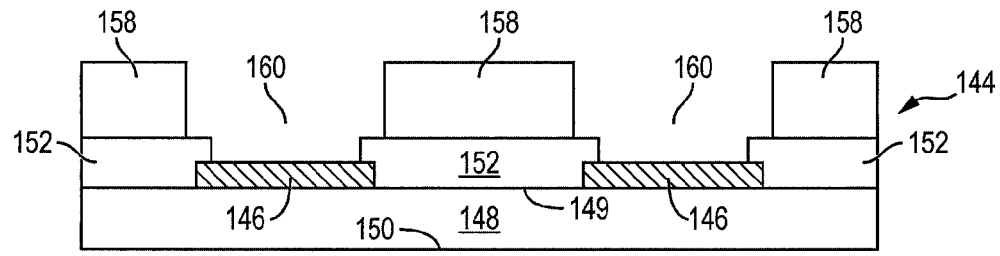
Figure 7E:
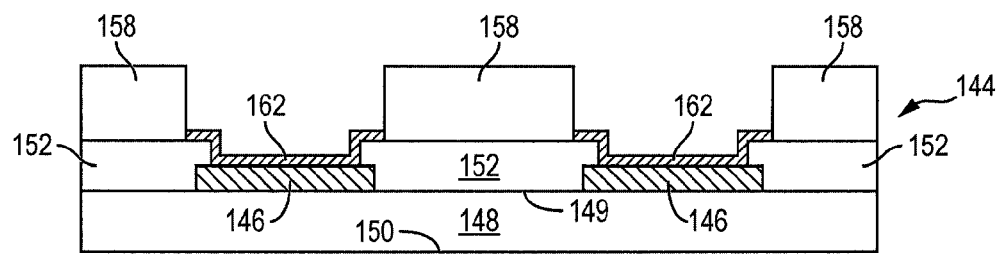
Figure 7F:
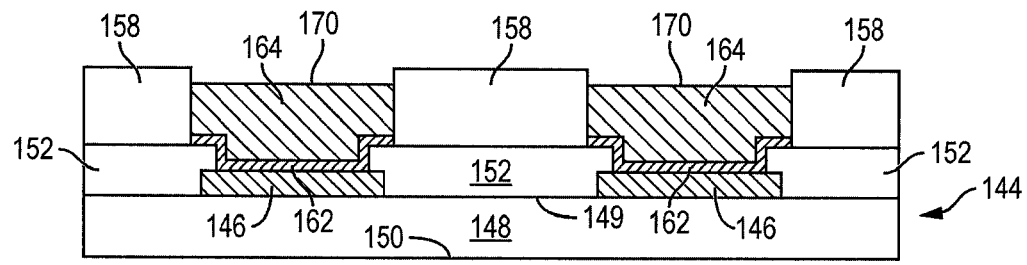
Figure 7G:
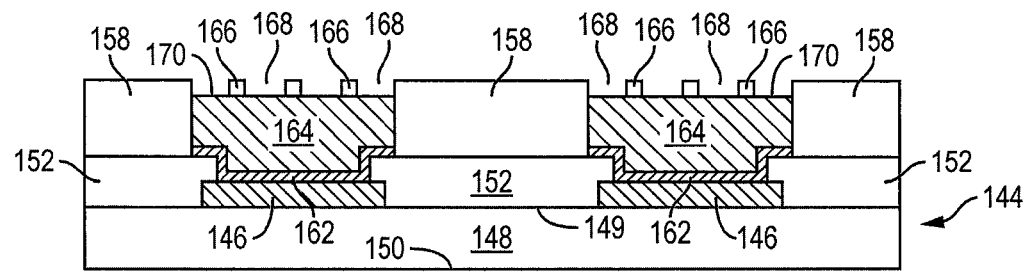
Figure 7H:
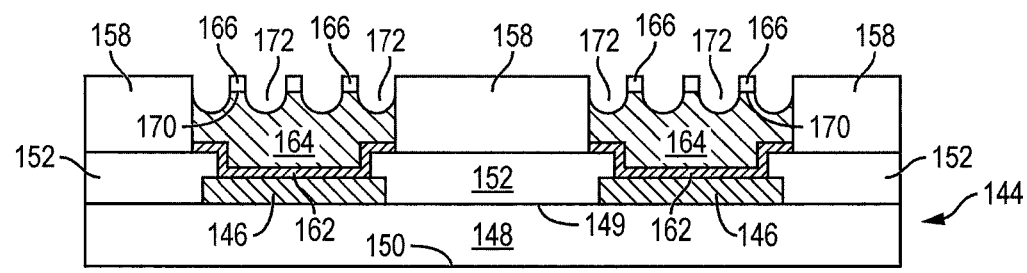
Figure 7I:
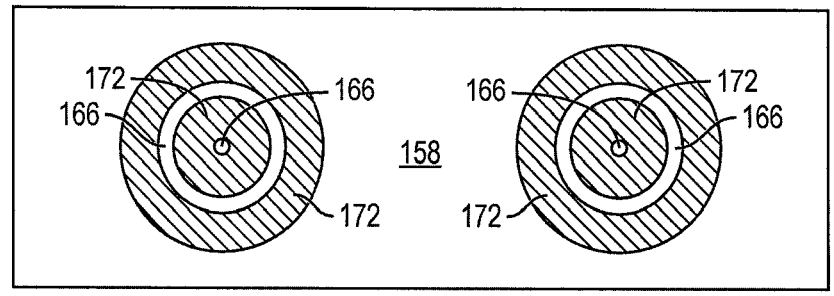
Figure 7J:
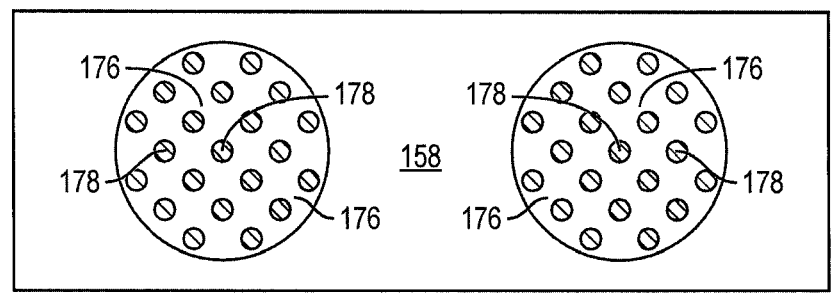
Figure 7K:
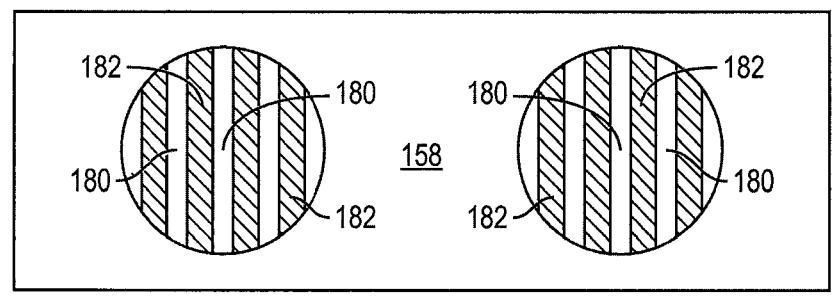
Figure 7L:
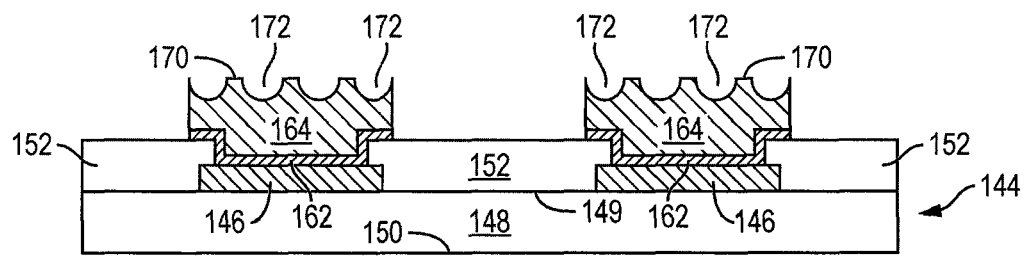
Figure 7M:
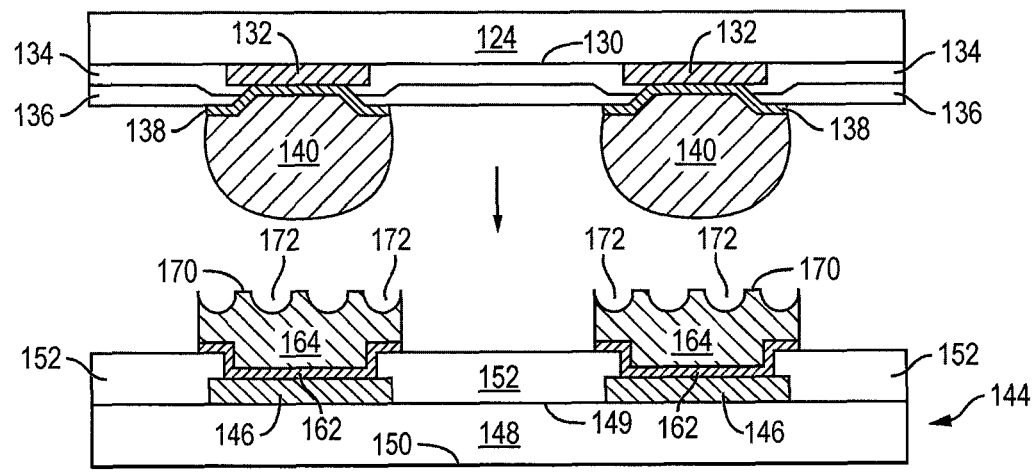
Figure 7N:
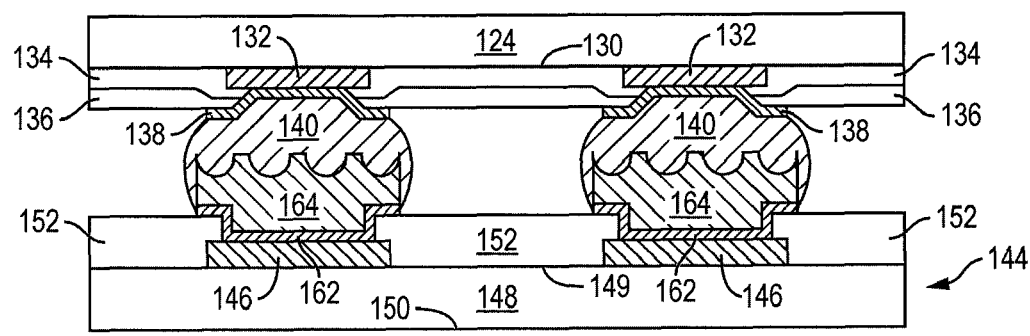
Figure 7O:
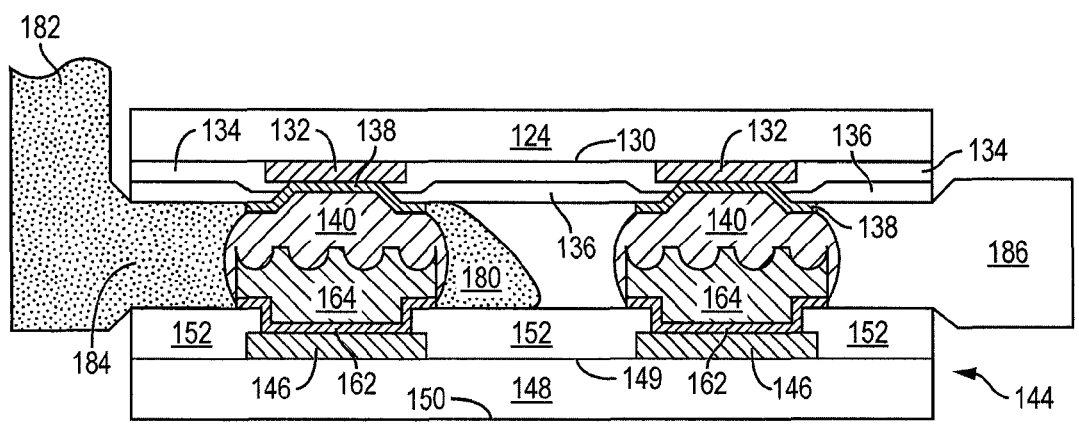
Figure 7P:
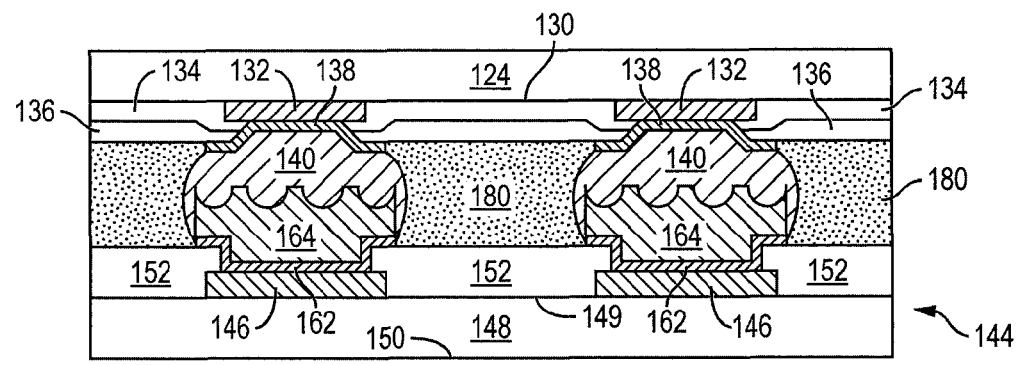

FIGS. 7a-7p illustrate, in relation to FIGS. 4 and 5a-5c, a process of forming a bump structure with conductive pads having recesses to expand the interconnect surface area of the conductive pads for enhanced interconnection properties. FIG. 7a shows a substrate or PCB 144 having one or more conductive layers 146 formed on laminated insulating or dielectric layers 148. The insulating layers 148 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Conductive layer 146 can be one or more layers of Al, Cu, Sn, Ni, Au, Ag, or other suitable electrically conductive material formed by electrolytic plating or electroless plating for electrical interconnect. The layout of conductive layer 146 and insulating layers 148 typically uses silk screen printing, photoengraving, PCB milling, electroless plating, or electroplating process. Substrate 144 may have a plurality of conductive vias formed through substrate 144 to extend conductive layer 146 from top surface 149 to bottom surface 150 of the substrate.

In FIG. 7b, a thick insulating layer 152 is formed over conductive layer 146 and insulating layer 148 using PVD, CVD, printing, spin coating, spray coating, sintering or thermal oxidation. The insulating layer 152 can contain one or more layers of SiO2, Si3N4, SiON, Ta2O5, Al2O3, solder resist, or other photo-sensitive material. In one embodiment, insulating layer 152 has a thickness of 20 micrometers (μm). A portion of insulating layer 152 is removed by patterning, exposure to UV light, and developing to form openings 154 and expose conductive layer 146.

In another example of forming openings 154, the solder resist includes a DFR material with a PET support film. The DFR material is irradiated using a visible light laser to form a pattern of non-irradiated DFR material aligned over conductive layer 146. The irradiated DFR material is then subjected to a developer which selectively dissolves non-irradiated portions of the DFR material and forms openings 154, while leaving the irradiated portions of the DFR material intact.

Alternatively, openings 154 are formed by laser direct ablation (LDA) using laser 156 to remove portions of insulating layer 152 to expose conductive layer 146 in applications requiring finer interconnect dimensions, as shown in FIG. 7c.

In FIG. 7d, a protective masking layer 158 is formed over insulating layer 152 with patterned openings 160 disposed over conductive layer 146 and a portion of insulating layer 152 proximate to the conductive layer. In one embodiment, protective masking layer 158 has a thickness of 50 μm.

In FIG. 7e, an electrically conductive layer 162 is conformally applied over conductive layer 146 and the portion of insulating layer 152 proximate to conductive layer 146 within patterned openings 160 using an electrolytic plating or electroless plating process. Conductive layer 162 can be multiple layers of Al, Cu, Sn, Ni, Au, or Ag. Conductive layer 162 follows the contour of insulation layer 152 and conductive layer 146. In one embodiment, conductive layer 162 is a seed layer electrically connected to conductive layer 146.

In FIG. 7f, an electrically conductive material is deposited within patterned openings 160 using a metal deposition process such as PVD, CVD, sputtering, electrolytic plating, and electroless plating. The conductive material can be multiple layers of Al, palladium (Pd), Cu, Sn, Ni, Au, or Ag. The conductive material partially fills openings 160 to form conductive pads 164. In one embodiment, conductive pads 164 contain multiple layers of Ni/Pd/Au with a total height of 40 μm. Alternatively, conductive pads 164 is a solder plated on pad (SPOP). Conductive pads 164 are electrically connected to conductive layers 146 and 162.

In FIG. 7g, a protective masking layer 166 with patterned openings 168 is formed over surface 170 of conductive pads 164. In FIG. 7h, surface 170 of conductive pads 164 is subjected to an etching process, such as alkalinity chemical etching, to remove a portion of the conductive pads and form recesses 172. In one embodiment, recesses 172 extend from surface 170 to a depth of 5 μm into conductive pads 164. In another embodiment, a portion of conductive pads 164 is removed by a roughening process to a depth of 5 μm within patterned openings 168. Recesses 172 expand the interconnect surface area of conductive pads 164 to include surface 170 and the inner surface areas within the recesses.

FIG. 7i shows a top view of protective masking layers 158 and 166 with recesses 172 formed into conductive pads 164 as concentric rings within patterned openings 168. FIG. 7j shows a top view of another embodiment of protective masking layers 158 and 176 with recesses 178 formed into conductive pads 164 as an arrangement of circular recesses within the patterned openings of protective masking layer 176. FIG. 7k shows a top view of another embodiment of protective masking layers 158 and 180 with recesses 182 formed into conductive pads 164 as an arrangement of parallel linear trenches within the patterned openings of protective masking layer 180.

Continuing from FIG. 7h, protective masking layers 158 and 166 are removed, leaving conductive pads 164 with recesses 172 extending from surface 170 into the conductive pads, as shown in FIG. 7l. Conductive pads 164 with recesses 172 have an expanded interconnect surface area, including surface 170 and the inner surface area within the recesses of the conductive pads, for later-bonded bumps 140.

In FIG. 7m, semiconductor die 124 from FIGS. 6a-6c are positioned over substrate 144 using a pick and place operation with active surface 130 and bumps 140 oriented toward the substrate. Bumps 140 are aligned with conductive pads 164. Bumps 140 are metallurgically and electrically connected to the expanded interconnect surface 170 and recesses 172 of conductive pads 164 by reflow or compression bonding. FIG. 7n shows semiconductor die 124 mounted to substrate 144 with bumps 140 contacting and bonded to the expanded interconnect surface 170 and recesses 172 of conductive pads 164. The expanded interconnect surface area of conductive pads 164, including surface 170 and the inner surface area within recesses 172, increases the joint or bonding mechanical strength and wettability between the bumps and conductive pads. The expanded interconnect surface area of conductive pads 164 aids with alignment between bumps 140 and the conductive pads. The expanded interconnect surface area of conductive pads 164 also increases heat dissipation through bumps 140. Conductive pads 164 can be positioned with a fine pitch, e.g., less than 140 μm.

In FIG. 7o, a mold underfill (MUF) material 180 is deposited between semiconductor die 124 and substrate 144. In one embodiment, MUF 180 is injected under pressure from a dispensing needle 182 into gap 184 between semiconductor die 124 and substrate 144 using MUF process. A vacuum assist 186 can draw MUF 180 to aid with uniform distribution. MUF 180 can be polymer composite material, such as epoxy resin with filler, epoxy acrylate with filler, or polymer with proper filler. MUF 180 is non-conductive and environmentally protects the semiconductor device from external elements and contaminants. FIG. 7p shows MUF 180 disposed between semiconductor die 124 and substrate 144. The fixed standoff distance between semiconductor die 124 and substrate 144, as maintained by conductive pads 164, reduces voids in MUF 180.

Figure 8A:
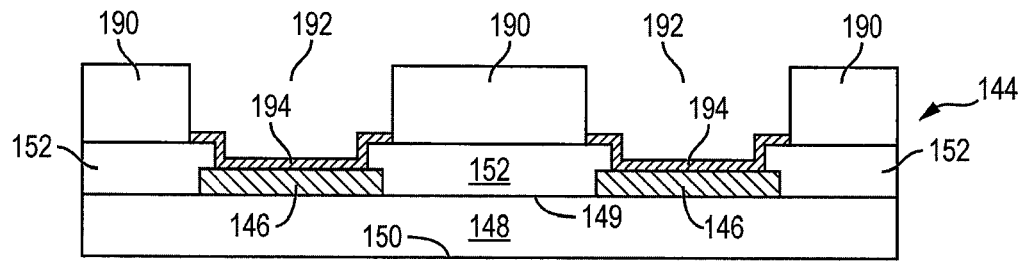
FIGS. 8a-8j illustrate a process of forming a bump structure with stacked conductive pads having an expanded interconnect surface area.

FIGS. 8a-8j illustrate, in relation to FIGS. 4 and 5a-5c, a process of forming a bump structure with stacked conductive pads having an expanded interconnect surface area for enhanced interconnection properties. Continuing from FIG. 7b, a protective masking layer 190 is formed over insulating layer 152 with patterned openings 192 disposed over conductive layer 146 and a portion of insulating layer 152 proximate to the conductive layer, as shown in FIG. 8a.

An electrically conductive layer 194 is conformally applied over conductive layer 146 and the portion of insulating layer 152 proximate to conductive layer 146 within patterned openings 192 using an electrolytic plating or electroless plating process. Conductive layer 194 can be multiple layers of Al, Cu, Sn, Ni, Au, or Ag. Conductive layer 194 follows the contour of insulation layer 152 and conductive layer 146. In one embodiment, conductive layer 194 is a seed layer electrically connected to conductive layer 146.

Figure 8B:
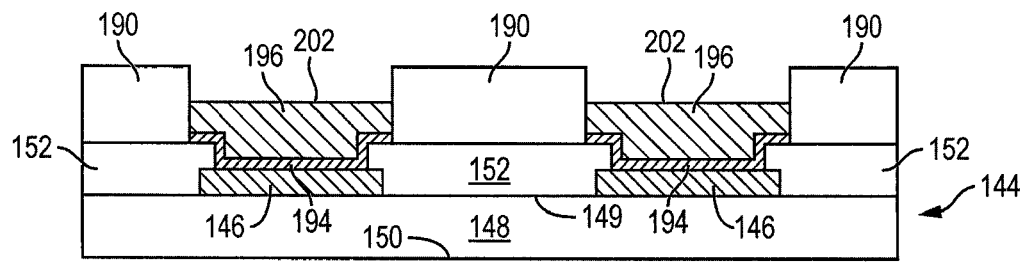

In FIG. 8b, an electrically conductive material is deposited within patterned openings 192 using a metal deposition process such as PVD, CVD, sputtering, electrolytic plating, and electroless plating. The conductive material can be multiple layers of Al, Pd, Cu, Sn, Ni, Au, or Ag. The conductive material partially fills openings 192 to form conductive pads 196. In one embodiment, conductive pads 196 contain multiple layers of Ni/Pd/Au with a height of 25-30 µm.

Figure 8C:
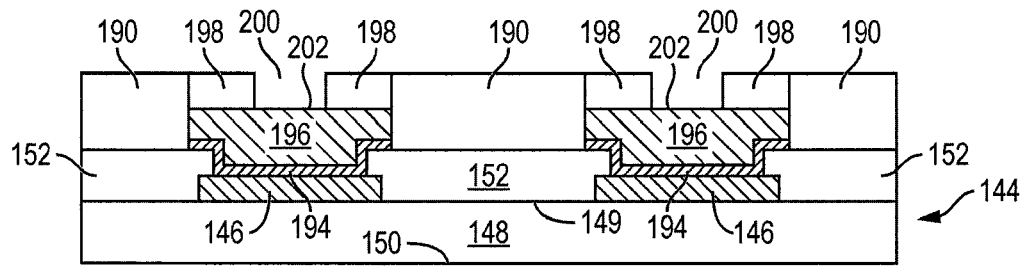

In FIG. 8c, a protective masking layer 198 with patterned openings 200 is formed over surface 202 of conductive pads 196. The patterned openings 200 are smaller than patterned openings 192.

Figure 8D:
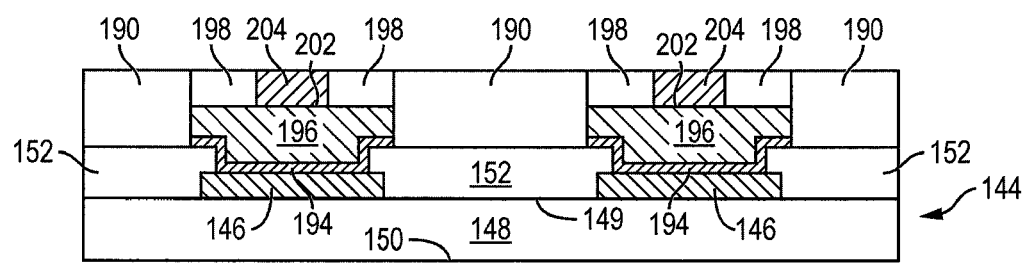

In FIG. 8d, an electrically conductive material is deposited over surface 202 of conductive pads 196 within patterned openings 200 using a metal deposition process such as PVD, CVD, sputtering, electrolytic plating, and electroless plating. The conductive material can be multiple layers of Al, Pd, Cu, Sn, Ni, Au, or Ag. The conductive material fills openings 200 to form conductive pads 204 stacked over conductive pads 196. In one embodiment, conductive pads 204 contain multiple layers of Ni/Pd/Au with a height of 10-15 µm. Alternatively, conductive pads 196 and 204 are an SPOP. Conductive pads 196 and 204 are electrically connected to conductive layers 146 and 194.

Figure 8E:
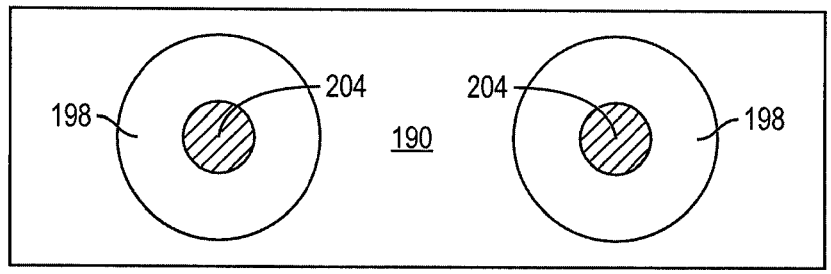

FIG. 8e shows a top view of protective masking layers 190 and 198 with conductive pads 204 formed within patterned openings 200.

Figure 8F:
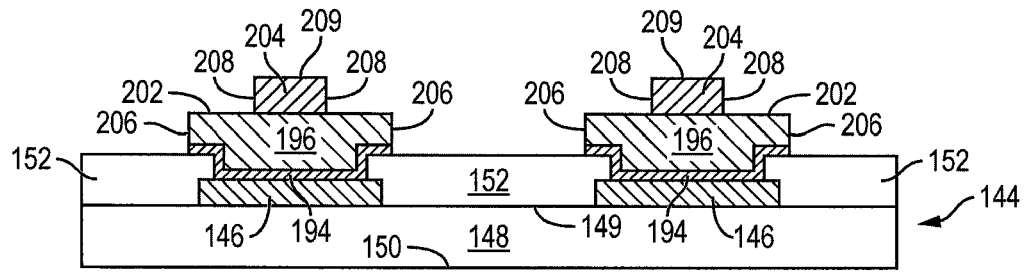

In FIG. 8f, protective masking layers 190 and 198 are removed, leaving conductive pads 204 stacked over conductive pads 196. The smaller patterned openings 200 cause a width of conductive pads 204 to be smaller than a width of conductive pads 196. The difference is width between conductive pads 196 and 204 results in an expanded interconnect surface area of the composite stacked conductive pads, including the exposed sidewall 206 and top surface 202 of conductive pads 196 and exposed sidewall 208 and top surface 209 of conductive pads 204. The stacked conductive pads 196 and 204 have an expanded interconnect surface area by nature of the exposed sidewalls and top surfaces of the stacked conductive pads.

Figure 8G:
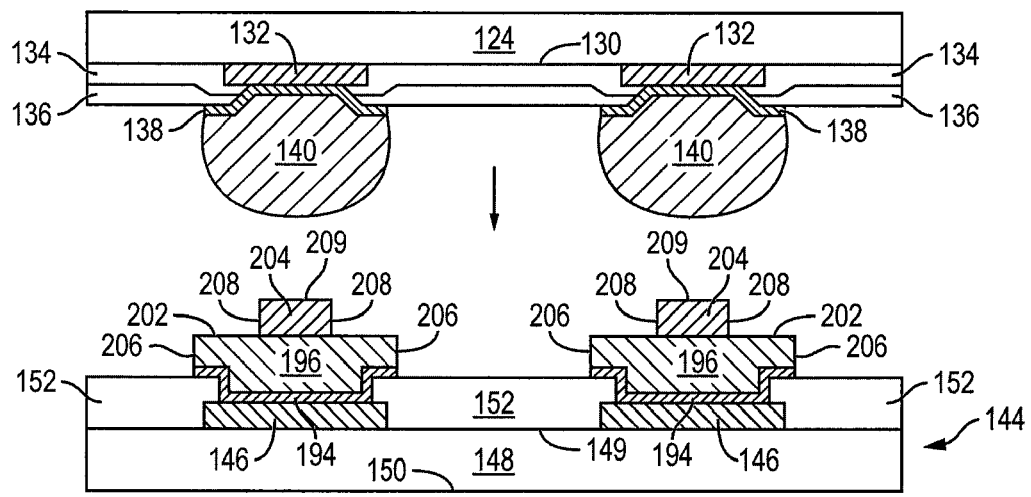
Figure 8H:
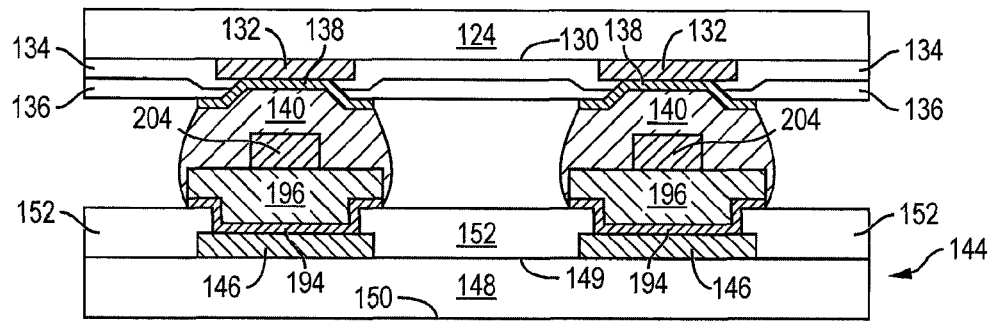

In FIG. 8g, semiconductor die 124 from FIGS. 6a-6c are positioned over substrate 144 using a pick and place operation with active surface 130 and bumps 140 oriented toward the substrate. Bumps 140 are aligned with the stacked conductive pads 196 and 204. Bumps 140 are metallurgically and electrically connected to the expanded surface area of stacked conductive pads 196 and 204 by reflow or compression bonding. FIG. 8h shows semiconductor die 124 mounted to substrate 144 with bumps 140 contacting and bonded to the expanded surface area of stacked conductive pads 196 and 204. The expanded interconnect surface area of the stacked conductive pads 196 and 204, including the exposed sidewalls 206 and 208 and top surfaces 202 and 209, increases the joint or bonding mechanical strength and wettability between the bumps and conductive pads. The expanded interconnect surface area of the stacked conductive pads 196 and 204 aids with alignment between bumps 140 and the conductive pads. The expanded interconnect surface area of the stacked conductive pads 196 and 204 also increases heat dissipation through bumps 140. Conductive pads 196 can be positioned with a fine pitch, e.g., less than 140 µm.

Figure 8I:
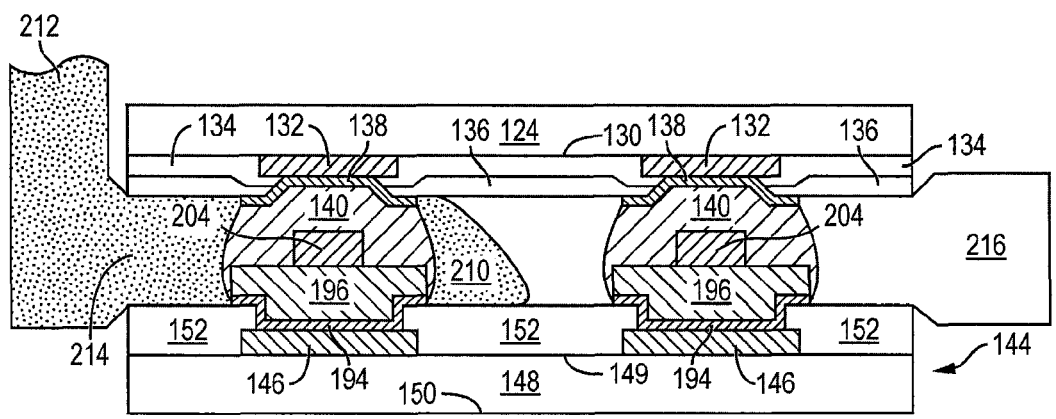
Figure 8J:
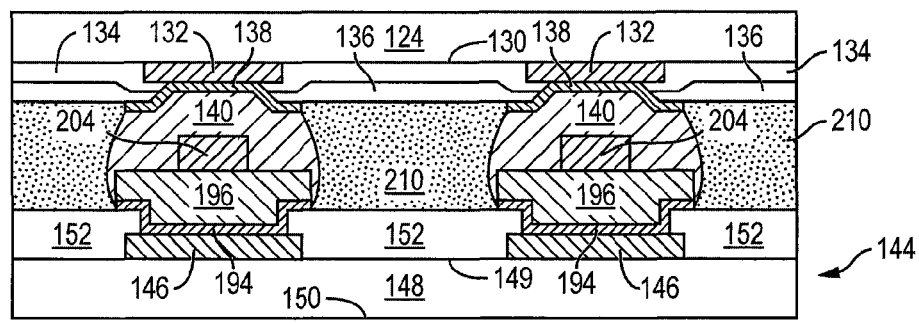

In FIG. 8i, a MUF material 210 is deposited between semiconductor die 124 and substrate 144. In one embodiment, MUF 210 is injected under pressure from a dispensing needle 212 into gap 214 between semiconductor die 124 and substrate 144 using MUF process. A vacuum assist 216 can draw MUF 210 to aid with uniform distribution. MUF 210 can be polymer composite material, such as epoxy resin with filler, epoxy acrylate with filler, or polymer with proper filler. MUF 210 is non-conductive and environmentally protects the semiconductor device from external elements and contaminants. FIG. 8j shows MUF 210 disposed between semiconductor die 124 and substrate 144. The fixed standoff distance between semiconductor die 124 and substrate 144, as maintained by stacked conductive pads 196 and 204, reduces voids in MUF 210.

Figure 9A:
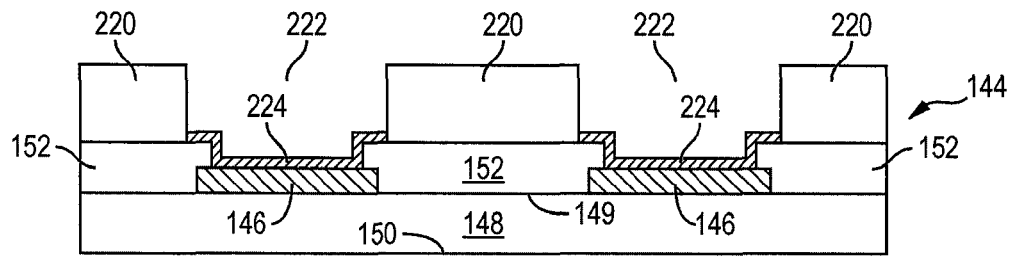
FIGS. 9a-9j illustrate another process of forming a bump structure with stacked conductive pads having an expanded interconnection surface area.

FIGS. 9a-9j illustrate, in relation to FIGS. 4 and 5a-5c, another process of forming a bump structure with stacked conductive pads having an expanded interconnect surface area for enhanced interconnection properties. Continuing from FIG. 7b, a protective masking layer 220 is formed over insulating layer 152 with patterned openings 222 disposed over conductive layer 146 and a portion of insulating layer 152 proximate to the conductive layer, as shown in FIG. 9a.

An electrically conductive layer 224 is conformally applied over conductive layer 146 and the portion of insulating layer 152 proximate to conductive layer 146 within patterned openings 222 using an electrolytic plating or electroless plating process. Conductive layer 224 can be multiple layers of Al, Cu, Sn, Ni, Au, or Ag. Conductive layer 224 follows the contour of insulation layer 152 and conductive layer 146. In one embodiment, conductive layer 224 is a seed layer electrically connected to conductive layer 146.

Figure 9B:
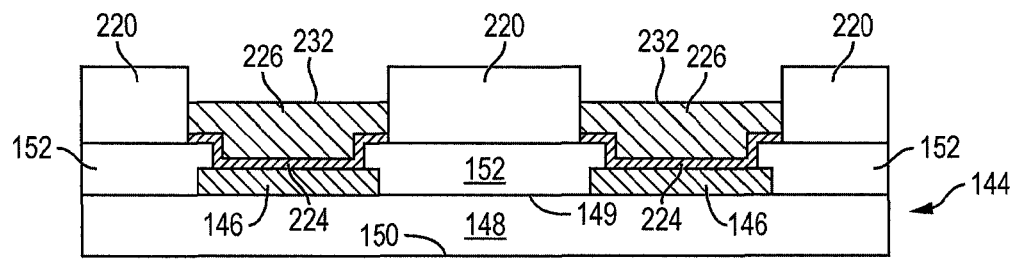

In FIG. 9b, an electrically conductive material is deposited within patterned openings 222 using a metal deposition process such as PVD, CVD, sputtering, electrolytic plating, and electroless plating. The conductive material can be multiple layers of Al, Pd, Cu, Sn, Ni, Au, or Ag. The conductive material partially fills openings 222 to form conductive pads 226. In one embodiment, conductive pads 226 contain multiple layers of Ni/Pd/Au with a height of 25-30 µm.

Figure 9C:
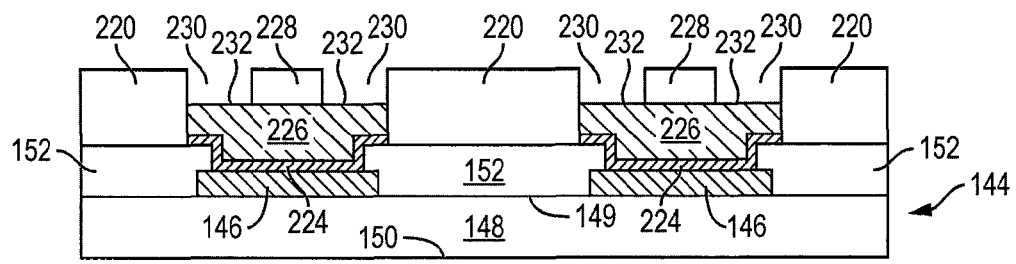

In FIG. 9c, a protective masking layer 228 with patterned openings 230 is formed over surface 232 of conductive pads 226. The patterned openings 230 are smaller than patterned openings 222.

Figure 9D:
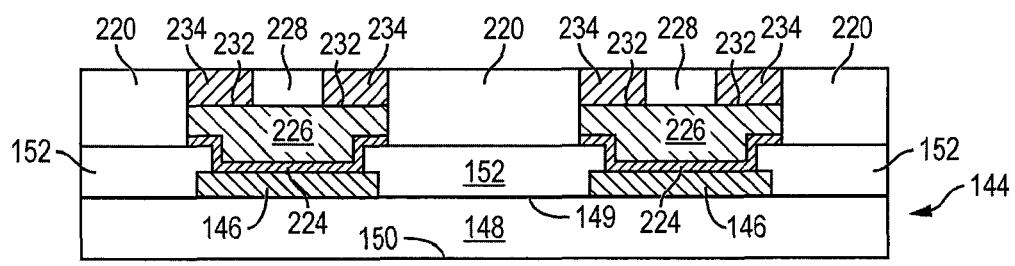

In FIG. 9d, an electrically conductive material is deposited over surface 232 of conductive pads 226 within patterned openings 230 using a metal deposition process such as PVD, CVD, sputtering, electrolytic plating, and electroless plating. The conductive material can be multiple layers of Al, Pd, Cu, Sn, Ni, Au, or Ag. The conductive material fills openings 230 to form conductive pads 234 stacked over conductive pads 226. In one embodiment, conductive pads 234 contain multiple layers of Ni/Pd/Au with a height of 10-15 μm. Alternatively, conductive pads 226 and 234 are an SPOP. Conductive pads 226 and 234 are electrically connected to conductive layers 146 and 224.

Figure 9E:
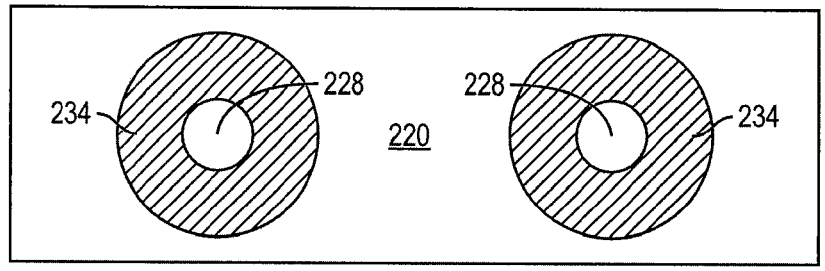

FIG. 9e shows a top view of protective masking layers 220 and 228 with conductive pads 234 formed within patterned openings 230.

Figure 9F:
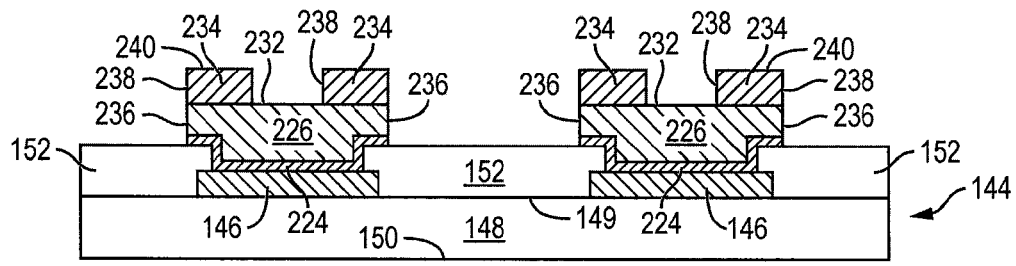

In FIG. 9f, protective masking layers 220 and 228 are removed, leaving conductive pads 234 stacked over conductive pads 226. The smaller patterned openings 230 cause the width of conductive pads 234 to be smaller than a width of conductive pads 226. The difference is width between conductive pads 226 and 234 results in an expanded interconnect surface area of the composite conductive pads, including the exposed sidewall 236 and top surface 232 of conductive pads 226 and exposed sidewall 238 and top surface 240 of conductive pads 234. The stacked conductive pads 226 and 234 have an expanded interconnect surface area by nature of the exposed sidewalls and top surfaces of the stacked conductive pads.

Figure 9G:
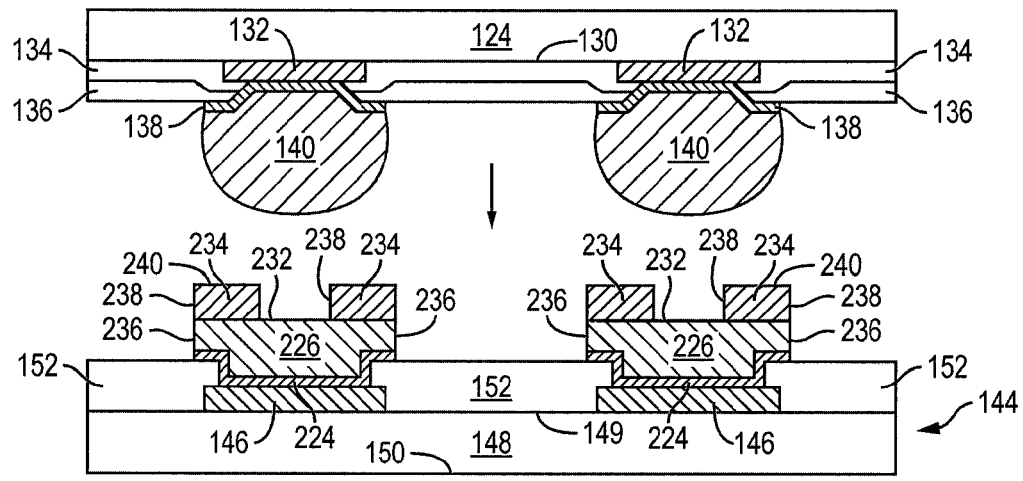
Figure 9H:
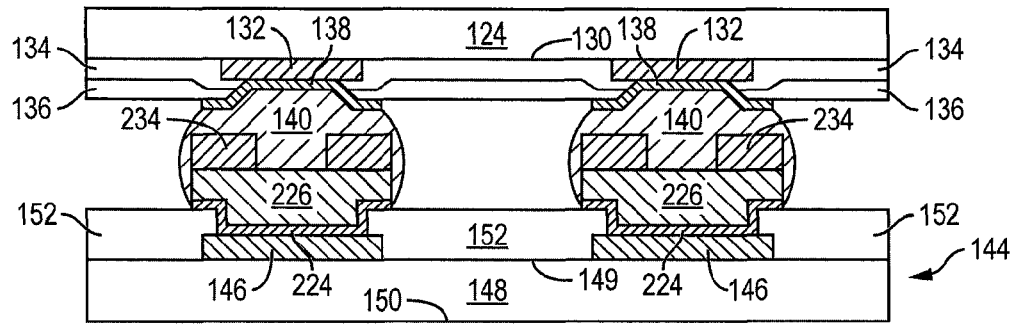

In FIG. 9g, semiconductor die 124 from FIGS. 6a-6c are positioned over substrate 144 using a pick and place operation with active surface 130 and bumps 140 oriented toward the substrate. Bumps 140 are aligned with the stacked conductive pads 226 and 234. Bumps 140 are metallurgically and electrically connected to the expanded surface area of stacked conductive pads 226 and 234 by reflow or compression bonding. FIG. 9h shows semiconductor die 124 mounted to substrate 144 with bumps 140 contacting and bonded to the expanded surface area of stacked conductive pads 226 and 234. The expanded interconnect surface area of the stacked conductive pads 226 and 234, including the exposed sidewalls 236 and 238 and top surfaces 232 and 240, increases the joint or bonding mechanical strength and wettability between the bumps and conductive pads. The expanded interconnect surface area of the stacked conductive pads 226 and 234 aids with alignment between bumps 140 and the conductive pads. The expanded interconnect surface area of the stacked conductive pads 226 and 234 also increases heat dissipation through bumps 140. Conductive pads 226 can be positioned with a fine pitch, e.g., less than 140 μm.

Figure 9I:
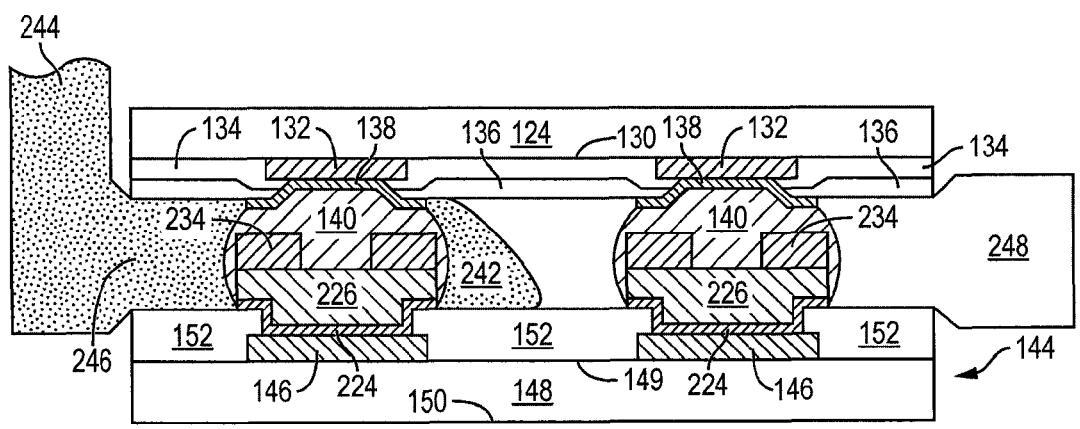
Figure 9J:
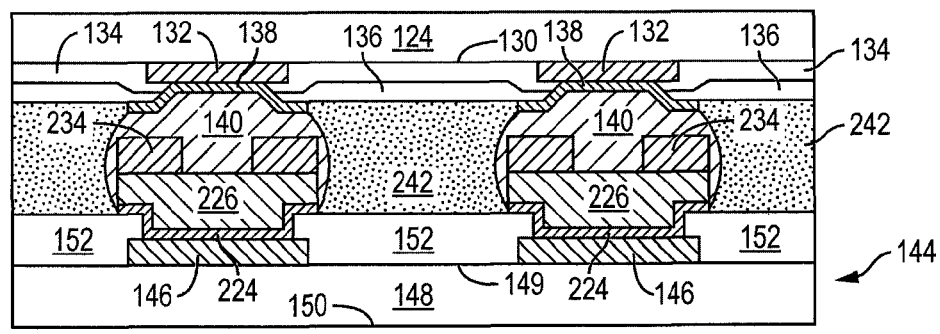

In FIG. 9i, a MUF material 242 is deposited between semiconductor die 124 and substrate 144. In one embodiment, MUF 242 is injected under pressure from a dispensing needle 244 into gap 246 between semiconductor die 124 and substrate 144 using MUF process. A vacuum assist 248 can draw MUF 242 to aid with uniform distribution. MUF 242 can be polymer composite material, such as epoxy resin with filler, epoxy acrylate with filler, or polymer with proper filler. MUF 242 is non-conductive and environmentally protects the semiconductor device from external elements and contaminants. FIG. 9j shows MUF 242 disposed between semiconductor die 124 and substrate 144. The fixed standoff distance between semiconductor die 124 and substrate 144, as maintained by stacked conductive pads 226 and 234, reduces voids in MUF 242.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a plurality of conductive pads over the substrate;
   expanding an interconnect surface area of the conductive pads by removing a first portion of the conductive pads to form a plurality of recesses partially into the conductive pads while retaining a second portion of the conductive pads under the recesses; and
   disposing a semiconductor die including a plurality of bumps over the substrate by bonding the bumps around the conductive pads and into the recesses of the expanded interconnect surface area of the conductive pads.

2. The method of claim 1, further including:
   forming an insulating layer including patterned openings over the conductive pads; and
   forming the recesses through a surface of the conductive pads within the patterned openings of the insulating layer.

3. The method of claim 2, wherein the patterned openings include ring openings, circular openings, or linear openings.

4. The method of claim 1, further including:
   forming a first conductive layer over the substrate;
   forming an insulating layer over the substrate;
   forming a second conductive layer over the first conductive layer; and
   forming the conductive pads over the second conductive layer.

5. The method of claim 1, further including depositing a mold underfill material between the semiconductor die and substrate.

6. A method of making a semiconductor device, comprising:
   providing a substrate;
   forming a first conductive pad over the substrate;
   expanding an interconnect surface area of the first conductive pad by forming a second conductive pad over a portion of the first conductive pad; and
   disposing a semiconductor die including an interconnect structure over the substrate by bonding the interconnect structure to the first conductive pad and second conductive pad while maintaining the expanded interconnect surface area.

7. The method of claim 6, wherein the second conductive pad includes a circular shape or ring shape.

8. The method of claim 6, further including depositing a mold underfill material between the semiconductor die and substrate.

9. The method of claim 6, further including:
   forming a first conductive layer over the substrate;
   forming an insulating layer over the substrate;
   forming a second conductive layer over the first conductive layer; and
   forming the first conductive pad over the second conductive layer.

10. A method of making a semiconductor device, comprising:
    providing a substrate;
    forming a first conductive pad over the substrate;
    expanding an interconnect surface area of the first conductive pad by forming a recess over the first conductive pad; and disposing a semiconductor die including an interconnect structure over the substrate by bonding the interconnect structure into the expanded interconnect surface area of the first conductive pad.

11. The method of claim 10, further including forming a plurality of recesses partially into the first conductive pad while retaining a portion of the first conductive pad under the recesses.

12. The method of claim 11, further including:
   forming an insulating layer with patterned openings disposed over the first conductive pad; and
   forming the recesses through a surface of the first conductive pad within the patterned openings of the insulating layer.

13. The method of claim 12, wherein the patterned openings include ring openings, circular openings, or linear openings.

14. The method of claim 10 further including forming a second conductive pad over the first conductive pad.

15. The method of claim 14, wherein the second conductive pad includes a circular shape or ring shape.

16. The method of claim 10, further including depositing a mold underfill material between the semiconductor die and substrate.

17. A semiconductor device, comprising:
   a substrate;
   a first conductive pad formed over the substrate with an expanded interconnect surface area formed over the first conductive pad; and
   a semiconductor die including an interconnect structure disposed over the substrate with the interconnect structure bonded around the first conductive pad and into the expanded interconnect surface area of the first conductive pad.

18. The semiconductor device of claim 17, wherein the expanded interconnect surface area of the first conductive pad includes a plurality of recesses formed partially into the first conductive pad while retaining a portion of the first conductive pad under the recesses.

19. The semiconductor device of claim 18, wherein the recesses include a ring shape, circular shape, or linear shape.

20. The semiconductor device of claim 17, wherein the expanded interconnect surface area of the first conductive pad includes a second conductive pad formed over the first conductive pad.

21. The semiconductor device of claim 17, further including depositing a mold underfill material between the semiconductor die and substrate.

* * * * *